United States Patent
Kumashiro et al.

(10) Patent No.: US 11,130,459 B2
(45) Date of Patent: Sep. 28, 2021

(54) SENSOR PROTECTOR AND VEHICLE EQUIPPED THEREWITH

(71) Applicant: TOYOTA JIDOSHA KABUSHIKI KAISHA, Toyota (JP)

(72) Inventors: Takuto Kumashiro, Toyota (JP); Kenji Furumoto, Toyota (JP); Hiroshi Tomita, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 143 days.

(21) Appl. No.: 16/405,447

(22) Filed: May 7, 2019

(65) Prior Publication Data

US 2019/0366963 A1    Dec. 5, 2019

(30) Foreign Application Priority Data

May 29, 2018    (JP) .............................. JP2018-102680

(51) Int. Cl.
*B60R 19/48*    (2006.01)
*G01S 13/931*    (2020.01)
*B60R 19/03*    (2006.01)
*B60R 19/24*    (2006.01)
*H05K 9/00*    (2006.01)

(52) U.S. Cl.
CPC .............. *B60R 19/483* (2013.01); *B60R 19/03* (2013.01); *B60R 19/24* (2013.01); *H05K 9/002* (2013.01); *G01S 2013/93275* (2020.01)

(58) Field of Classification Search
CPC ..... B60R 21/0134; B60R 19/03; B60R 19/24; B60R 19/483; G01S 7/02; G01S 13/931; G01S 2013/93275; G01S 2007/027
See application file for complete search history.

(56) References Cited

U.S. PATENT DOCUMENTS

| | | | |
|---|---|---|---|
| 8,690,206 B1* | 4/2014 | Yamasaki | B60R 16/00 293/15 |
| 10,107,894 B2* | 10/2018 | Cho | H01Q 1/42 |
| 10,160,292 B2* | 12/2018 | Chin | B60H 1/26 |
| 10,518,728 B2* | 12/2019 | Furumoto | G01S 13/931 |
| 10,576,922 B2* | 3/2020 | Yasui | B60R 19/483 |
| 2002/0125383 A1 | 9/2002 | Takahashi | |
| 2004/0227663 A1* | 11/2004 | Suzuki | H01Q 17/001 342/70 |

(Continued)

FOREIGN PATENT DOCUMENTS

| | | |
|---|---|---|
| CN | 201575383 U | 9/2010 |
| JP | 2002-264743 A | 9/2002 |

(Continued)

*Primary Examiner* — Gregory A Blankenship
(74) *Attorney, Agent, or Firm* — Sughrue Mion, PLLC

(57) ABSTRACT

A sensor protector configured including a mount, a plate shaped cover, and an electromagnetic wave shield is provided. The mount is mounted at a bracket configured to fix a sensor, provided at an inner side of a bumper cover, to a body of a vehicle. The plate shaped cover that extends from a lower portion of the mount toward the bumper cover with an end portion of the cover, at an outer side in a vehicle front-rear direction, separated from the bumper cover, and covers a lower portion of the sensor as viewed from a lower side of the vehicle. The electromagnetic wave shield is provided to at least a portion of the cover.

14 Claims, 7 Drawing Sheets

(56) References Cited

U.S. PATENT DOCUMENTS

| | | | |
|---|---|---|---|
| 2004/0246172 A1* | 12/2004 | Hirose | G01S 13/003 |
| | | | 342/198 |
| 2010/0120317 A1 | 5/2010 | Shakory-Tabrizi | |
| 2014/0070982 A1* | 3/2014 | Inada | B60R 19/483 |
| | | | 342/188 |
| 2014/0111950 A1* | 4/2014 | Yamasaki | B60R 16/0239 |
| | | | 361/747 |
| 2014/0367980 A1* | 12/2014 | Appukutty | B60R 19/483 |
| | | | 293/117 |
| 2018/0215324 A1* | 8/2018 | Kataoka | B60R 19/483 |
| 2018/0222382 A1* | 8/2018 | Inoue | G01S 15/931 |
| 2019/0100162 A1* | 4/2019 | Furumoto | G01S 7/02 |
| 2019/0366963 A1* | 12/2019 | Kumashiro | H05K 9/002 |
| 2020/0079309 A1* | 3/2020 | Lund | G01S 7/02 |
| 2020/0101916 A1* | 4/2020 | Furumoto | B60R 19/30 |
| 2020/0172020 A1* | 6/2020 | Nakayama | G06K 9/00791 |

FOREIGN PATENT DOCUMENTS

| | | |
|---|---|---|
| JP | 2007-106199 A | 4/2007 |
| JP | 2012-225731 A | 11/2012 |
| JP | 2012-225733 A | 11/2012 |
| JP | 2014-134414 A | 7/2014 |
| JP | 2014-205473 A | 10/2014 |
| JP | 2015-212705 A | 11/2015 |
| JP | 2019064417 A | 4/2019 |

\* cited by examiner

SENSOR PROTECTOR AND VEHICLE EQUIPPED THEREWITH

CROSS-REFERENCE TO RELATED APPLICATION

This application is based on and claims priority under 35 USC 119 from Japanese Patent Application No. 2018-102680 filed on May 29, 2018, the disclosure of which is incorporated by reference herein.

BACKGROUND

Technical Field

The present disclosure relates to a sensor protector and a vehicle equipped with this sensor protector.

Related Art

Structures in which a sensor is provided at the vehicle inner side of a bumper cover in order to detect obstacles at the vehicle outer side are known. There is an issue in such structures due to some of the waves transmitted from the sensor being reflected by a back face of the bumper cover such that the reflected waves reach an object at the lower side of the sensor, resulting in incorrect detection of objects that are not obstacles.

Japanese Patent Application Laid-Open (JP-A) No. 2012-225731 discloses a configuration in which a housing box is provided in close contact with a back face of a rear bumper (bumper cover), and a radar device (sensor) is housed in the housing box. A lower face of the housing box is configured by a shield plate with metallic tape stuck to the surface, so as to close off an area between a lower portion of the radar device and the back face of the rear bumper. Accordingly, if some of the waves transmitted from the radar device are reflected by the back face of the rear bumper, the reflected waves are reflected by the shield plate and thereby prevented from reaching an object (road surface) at the lower side of the radar device.

However, in this related art, since the housing box is provided in close contact with the back face of the rear bumper, there is a chance of load being transmitted to the housing box or the radar device if collision load is input to the rear bumper.

Moreover, in cases in which the housing box is in contact with the back face of the rear bumper, if the placement of the radar device and the rear bumper vary depending on vehicle size, it is not possible to employ a common housing box.

There is accordingly room for improvement of the related art regarding these points.

SUMMARY

In consideration of the above circumstances, the present disclosure provides a highly versatile sensor protector that is also capable of both preventing incorrect detection by a sensor and improving sensor protection performance in a vehicle collision, and also to provide a vehicle provided with this sensor protector.

A sensor protector according to a first aspect of the present disclosure includes a mount, a plate shaped cover, and an electromagnetic wave shield. The mount is mounted at a bracket configured to fix a sensor provided at an inner side of a bumper cover to a body of a vehicle. The plate-shaped cover that extends from a lower portion of the mount toward the bumper cover an end portion of the cover, at an outer side in a vehicle front-rear direction separated from the bumper cover, and covers a lower portion of the sensor as viewed from a lower side of the vehicle. The electromagnetic wave shield is provided to at least a portion of the cover.

The sensor protector according to the first aspect of the present disclosure includes the plate shaped cover that covers the lower portion of the sensor as viewed from the vehicle lower side, and the electromagnetic wave shield is provided to at least a portion of the cover. Accordingly, when some of the electromagnetic waves emitted from the sensor are reflected by a back face of the bumper cover, reflected waves reaching the cover are further reflected by the electromagnetic wave shield. As a result, the reflected waves are suppressed from reaching an object at the lower side of the sensor (the lower side of the cover), thereby suppressing incorrect detection by the sensor.

The sensor protector also includes the mount that is mounted to the bracket configured to fix the sensor to the vehicle body. The sensor protector is thus fixed to the vehicle body through the bracket. Moreover, the cover is disposed extending from the lower portion of the mount toward the bumper cover with the vehicle front-rear direction outer side end portion of the cover separated from the bumper cover. This thereby enables sensor protection performance to be improved by suppressing the transmission of load to the sensor protector, even if the bumper cover is deformed in a head-on collision or a rear collision of the vehicle.

Moreover, as described above, the sensor protector and the bumper cover are disposed so as to be separated from each other, thereby enabling application in cases in which the positional relationship between the sensor and the bumper cover varies according to the vehicle size. This thereby enables the sensor protector to be commonly applied in plural vehicle models, increasing the versatility of the sensor protector.

A sensor protector according to a second aspect of the present disclosure is the sensor protector according to the first aspect, wherein the cover is disposed so as to be inclined toward a lower side in a vehicle vertical direction on progression toward the outer side in the vehicle front-rear direction.

In the sensor protector according to the second aspect of the present disclosure, the cover is disposed so as to be inclined toward the vehicle vertical direction lower side on progression toward the vehicle front-rear direction outer side. This thereby enables a broader detection range of the sensor to be secured than in cases in which the cover is disposed running along the vehicle front-rear direction. Namely, electromagnetic waves are emitted from the sensor toward the vehicle front-rear direction outer side in a radiating pattern. Thus, by disposing the cover so as to be inclined toward the vehicle vertical direction lower side on progression toward the vehicle front-rear direction outer side, the cover is prevented from interfering with the electromagnetic waves emitted from the sensor toward the vehicle front-rear direction outer side and vehicle lower side. This enables the detection range of the sensor to be effectively secured in comparison to cases in which the cover is disposed running along the vehicle front-rear direction.

A sensor protector according to a third aspect of the present disclosure is the sensor protector according to either the first aspect or the second aspect, wherein a weak portion configured to enable the cover to deform along a width direction of the sensor is formed at the cover.

In the sensor protector according to the third aspect of the present disclosure, even if the bumper cover deforms greatly in a head-on collision or a rear collision of the vehicle and the back face of the bumper cover contacts the sensor protector, the cover deforms along the width direction of the sensor at the weak portion, such that impact to the bumper cover is not readily transmitted to the sensor and the vehicle body. The protection performance of the sensor and the vehicle body is thereby improved.

A sensor protector according to a fourth aspect of the present disclosure is the sensor protector according to any one of the first aspect to the third aspect, wherein the sensor is provided at an inner side of an outer end portion, in a vehicle width direction of the bumper cover, and the electromagnetic wave shield is provided at a position on the cover covering a region positioned at an outer side, in the vehicle front-rear direction, of a region extending at least from a central portion of the sensor to an inner end portion of the sensor in the vehicle width direction.

In the sensor protector according to the fourth aspect of the present disclosure, electromagnetic waves reflected by the back face of the bumper cover are suppressed from reaching objects at the vehicle vertical direction lower side and vehicle width direction inner side of the sensor. Namely, if electromagnetic waves reflected by the back face of the bumper cover were to pass through the region of the cover positioned at the vehicle front-rear direction outer side of the region spanning from the central portion to the vehicle width direction inner end portion of the sensor, the electromagnetic waves would proceed toward the vehicle vertical direction lower side and vehicle width direction inner side of the sensor. In cases in which the sensor is provided at the vehicle inner side of the vehicle width direction outer end portion of the bumper cover as in the above configuration, bumper reinforcement is generally disposed at the vehicle vertical direction lower side and vehicle width direction inner side of the sensor. Thus, by providing the electromagnetic wave shield at a position on the cover covering the region positioned at an outer side, in the vehicle front-rear direction, of the region extending at least from the central portion to an inner end portion of the sensor in the vehicle width direction, the reflected waves are suppressed from reaching the bumper reinforcement. As a result, the bumper reinforcement is suppressed from being incorrectly detected as an obstacle at the vehicle front-rear direction outer side of the bumper cover by the sensor.

A vehicle according to a fifth aspect of the present disclosure includes a bumper cover that is provided at an end portion at an outer side in a vehicle front-rear direction, of a body of the vehicle, a bracket that is attached to the vehicle front-rear direction outer side end portion of the body at an inner side in the vehicle front-rear direction, of the bumper cover, a sensor that is attached to the bracket, and the sensor protector according to any one of the first aspect to the fourth aspect, with the sensor protector being attached to the bracket so as to cover a lower portion of the sensor.

In the vehicle according to the fifth aspect of the present disclosure, the sensor protector is the sensor protector of any one of the first aspect to the fourth aspect, thereby enabling the operation and advantageous effects described above to be obtained.

The sensor protector and vehicle equipped with this sensor protector according to the present disclosure enable incorrect detection by a sensor to be prevented and sensor protection performance in a vehicle collision to be improved, while also enabling increased versatility.

BRIEF DESCRIPTION OF THE DRAWINGS

Exemplary embodiments of the present disclosure will be described in detail based on the following figures, wherein.

DETAILED DESCRIPTION

Figure 1:
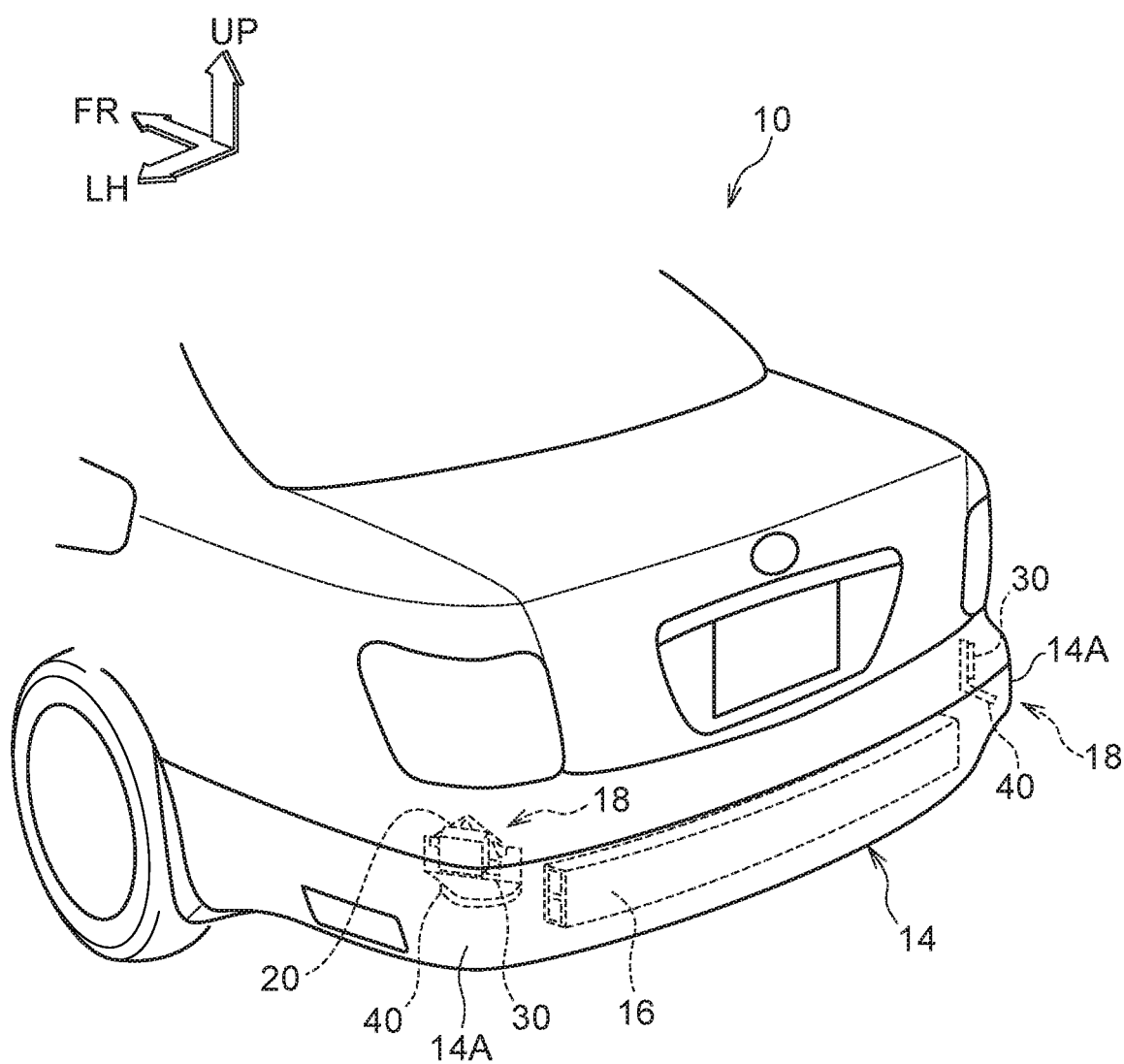
FIG. 1 is a perspective view of a vehicle mounted with a sensor assembly including a sensor protector according to an exemplary embodiment, as viewed from the rear.

Explanation follows regarding a vehicle 10 mounted with a sensor protector 40 according to an exemplary embodiment of the present disclosure, with reference to FIG. 1 to FIG. 7B. Note that for ease of explanation, in FIG. 1 and FIG. 5 to FIG. 7, the arrow FR indicates the vehicle front, the arrow UP indicates the vehicle upper side, and the arrow LH indicates the left side in a vehicle width direction, as appropriate. In FIG. 2 to FIG. 6, the arrow F indicates a device front side of a sensor assembly 18, the arrow U indicates the device upper side of the sensor assembly 18, and the arrow W indicates the device width direction of the sensor assembly 18.

Overall Configuration

As illustrated in FIG. 1 to FIG. 6, the sensor protector 40 according to the present exemplary embodiment is a configuration element of the sensor assembly 18. The sensor assembly 18 is attached to a corner section of the vehicle 10, and configures part of a detection section for detecting obstacles in the vehicle vicinity. Structurally, the sensor assembly 18 includes a bracket 20 fixed to the body of the vehicle 10, and a sensor 30 mounted to the bracket 20.

Figure 2:
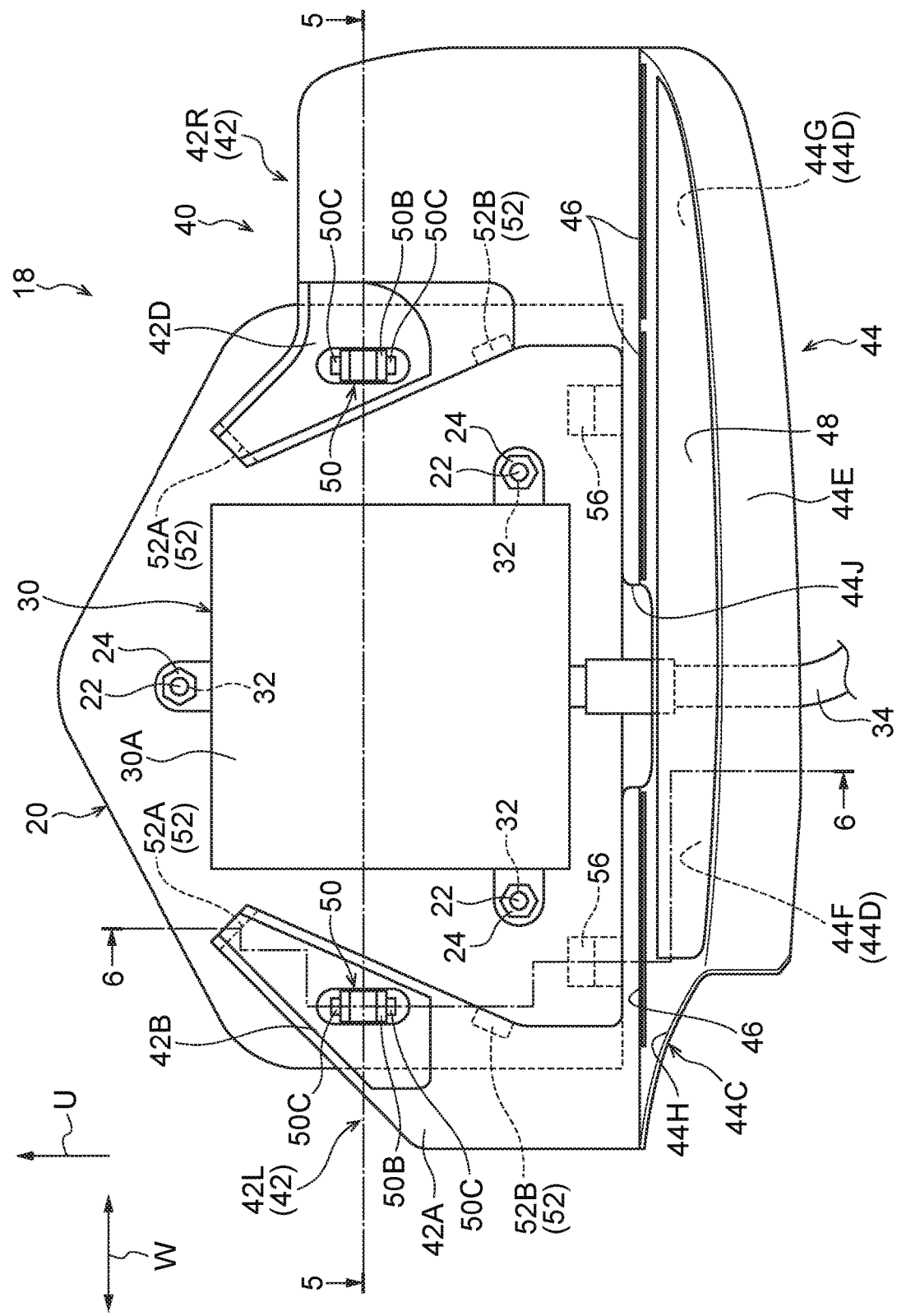
FIG. 2 is a back face view illustrating the sensor assembly illustrated in FIG. 1, as viewed from a device rear side.
Figure 3:
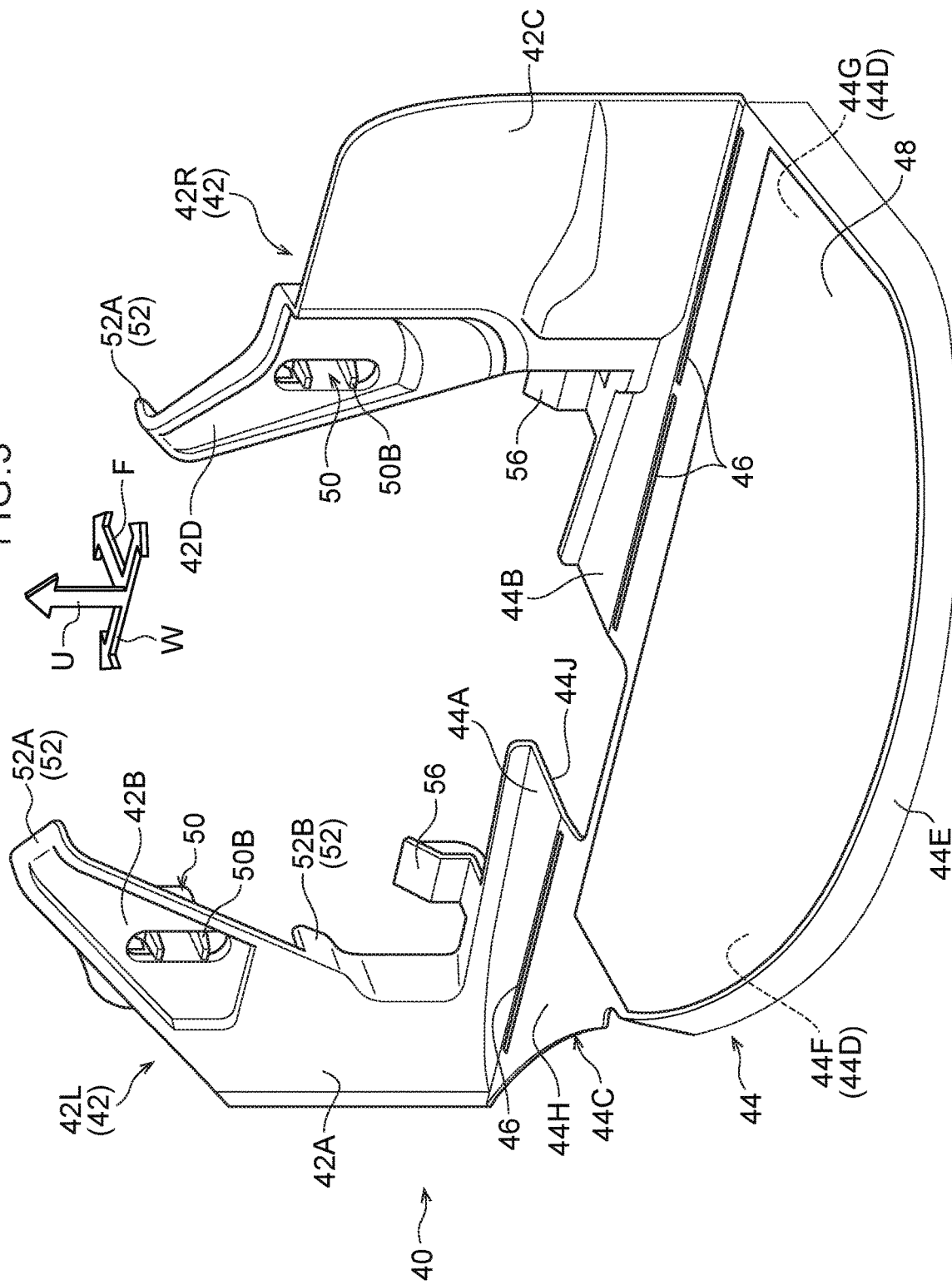
FIG. 3 is a perspective view illustrating a sensor protector according to the present exemplary embodiment, as viewed from the device rear side.
Figure 4:
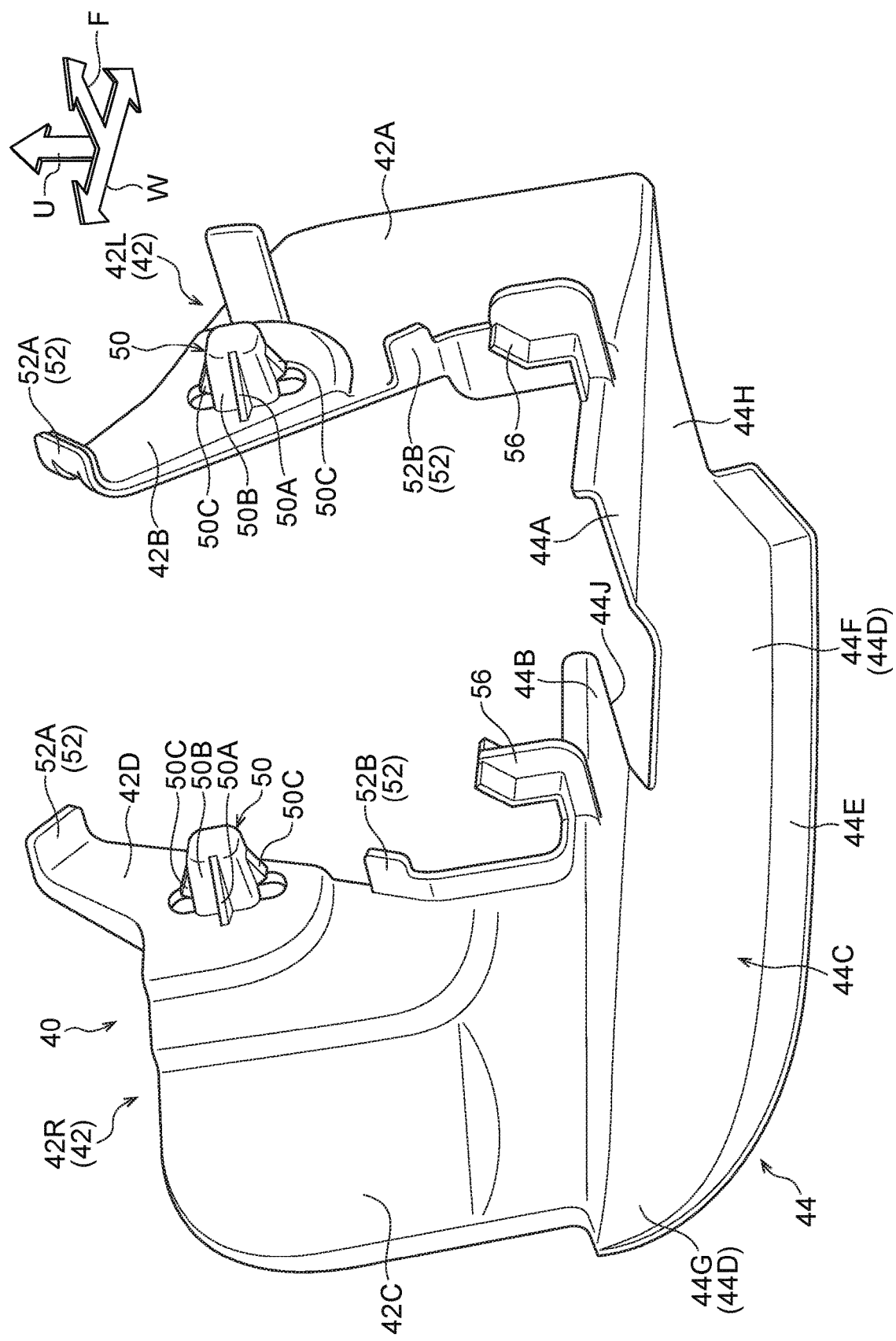
FIG. 4 is a perspective view illustrating the sensor protector illustrated in FIG. 3, as viewed from the device rear side.
Figure 5:
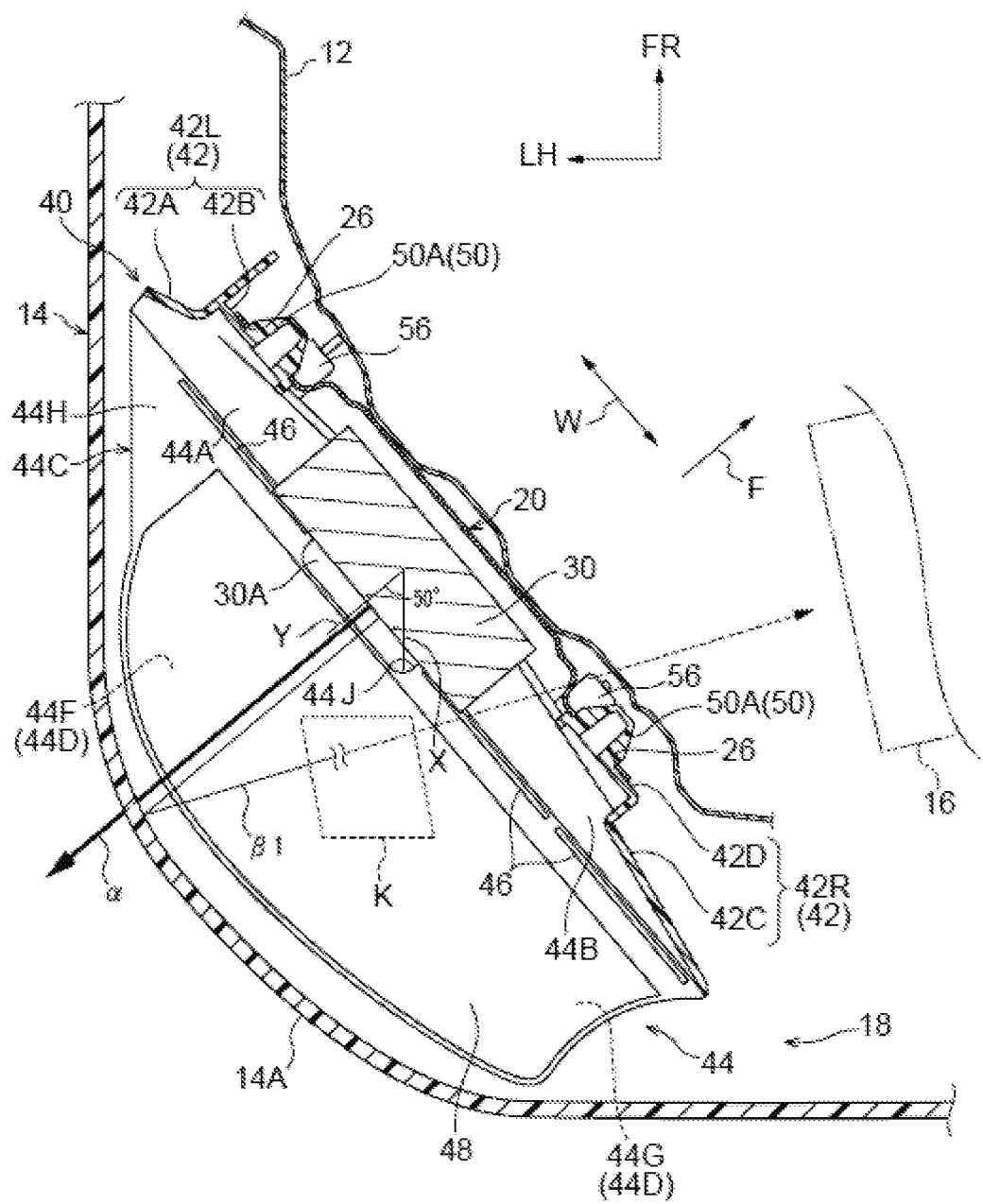
FIG. 5 is a cross-section illustrating a state sectioned along line 5-5 in FIG. 2.
Figure 6:
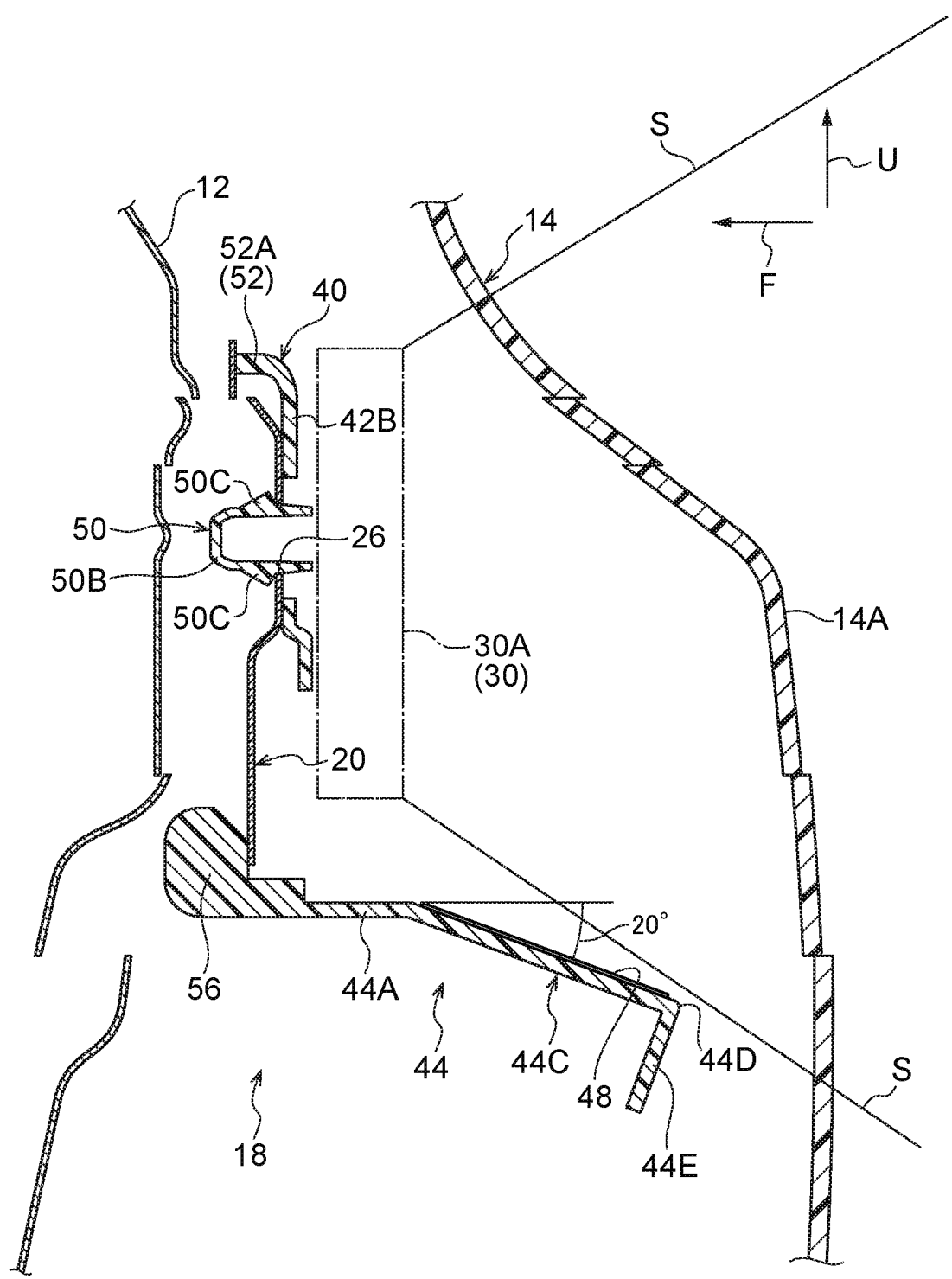
FIG. 6 is a cross-section illustrating a state sectioned along line 6-6 in FIG. 2.

FIG. 1 illustrates a pair of left and right sensor assemblies 18 attached at the vehicle rear. FIG. 2, FIG. 5, and FIG. 6 illustrate the sensor assembly 18 attached to the rear left of the vehicle. FIG. 3 and FIG. 4 illustrate the sensor protector 40 configuring the sensor assembly 18 attached to the rear left of the vehicle. The pair of sensor assemblies 18 illustrated in FIG. 1 have the same configuration as each other, albeit with left-right symmetry to each other. The following explanation therefore focuses on the sensor assembly 18 mounted at the rear left of the vehicle.

As illustrated in FIG. 5, the bracket 20 is configured from sheet metal, and is fixed by welding to a back panel 12, serving as a body configuration member. The sensor 30 is fixed to a device rear face of the bracket 20. More specifically, as illustrated in FIG. 2, the bracket 20 is provided with three bolts 22 formed projecting from the device rear face of the bracket 20. The bolts 22 are inserted through bolt holes 32 of the sensor 30. The bolt holes 32 are formed at three regions, namely at both device width direction ends and at a device upper edge of the sensor 30, and correspond to the three bolts 22. The bolts 22 are screwed together with nuts 24. The sensor 30 is thereby fixed to the bracket 20.

The sensor 30 includes a transmission/reception face 30A that emits and receives electromagnetic waves. Electromagnetic waves (millimeter waves) are emitted from the transmission/reception face 30A, and electromagnetic waves reflected by an obstacle are received by the transmission/reception face 30A, enabling detection of the obstacle. The transmission/reception face 30A of the sensor 30 is fixed to the vehicle 10 in a state inclined by 50° with respect to the vehicle front-rear direction (the angle between arrow X and arrow Y in FIG. 5), so as to be disposed in a state facing toward the oblique rear left side of the vehicle 10.

As illustrated in FIG. 1, FIG. 5, and FIG. 6, a resin rear bumper cover 14 is disposed at the vehicle outer side of the sensor 30. The transmission/reception face 30A of the sensor 30 is disposed facing a corner section 14A provided at a vehicle width direction left side portion of the rear bumper cover 14. Accordingly, the electromagnetic waves emitted from the transmission/reception face 30A of the sensor 30 pass through the corner section 14A of the rear bumper cover 14 and are emitted to the rear side of the vehicle (see arrow a in FIG. 5).

Note that bumper reinforcement 16 (referred to hereafter as reinforcement 16) configured by an aluminum-based metallic material, for example, is disposed at the vehicle front side of the rear bumper cover 14. The reinforcement 16 is formed with a hollow, substantially rectangular beam profile, and is disposed with its length direction along the vehicle width direction. A cross-section profile of the reinforcement 16 as sectioned in a direction orthogonal to its length direction is configured by plural (two in the present exemplary embodiment), substantially rectangular closed cross-sections forming a row in the vertical direction (see FIG. 1). As viewed along the vehicle front-rear direction, the reinforcement 16 is disposed between the pair of left and right sensors 30 provided to a rear section of the vehicle 10, and is disposed at the vehicle lower side of the sensors 30. Vehicle front-rear direction front end portions of the reinforcement 16 are coupled to rear end portions of a pair of left and right front side members (not illustrated in the drawings) configuring framework members of the vehicle 10.

Note that some of the electromagnetic waves emitted from the transmission/reception face 30A may be reflected by a back face of the rear bumper cover 14 on reaching the rear bumper cover 14 so as to reach the reinforcement 16 disposed at the vehicle lower side and vehicle front side of the sensor 30 (see arrow β1 in FIG. 5). If electromagnetic waves reflected by the reinforcement 16 were received by the transmission/reception face 30A, there would be a chance that the reinforcement 16 might be incorrectly detected as an obstacle at the vehicle rear side by the sensor 30. The sensor protector 40 is accordingly provided in order to prevent electromagnetic waves reflected by the back face of the rear bumper cover 14 from reaching the reinforcement 16.

The rear bumper cover 14 of the vehicle 10 of the present exemplary embodiment is open at the side of the sensor 30 facing the road surface, namely at the vehicle lower side. Namely, a gap is provided between the rear bumper cover 14 and the back panel 12 at the vehicle lower side (see FIG. 6). There is accordingly a need to provide the sensor 30 with measures to prevent stones kicked up from the vehicle lower side during travel, snow blowing in the vicinity, and the like from entering and interfering with the sensor 30. The sensor protector 40 is accordingly provided with a function to protect the sensor 30 from such stones and snow. Detailed explanation follows regarding the sensor protector 40.

Sensor Protector 40

FIG. 2 to FIG. 4 are external views of the sensor protector 40.

As illustrated in FIG. 2 and FIG. 3, the sensor protector 40 of the present exemplary embodiment includes a pair of mounts 42 extending along the device vertical direction, and a cover 44 extending from device lower end portions of the pair of mounts 42 toward the rear bumper cover 14 side (see FIG. 6). The cover 44 is provided with groove portions 46 and an electromagnetic wave shield 48. The sensor protector 40 is made of a resin such as polyacetal (POM) or polybutylene terephthalate (PBT).

As illustrated in FIG. 2, the mounts 42 are plate shaped members provided in a pair on the left and right sides of the sensor 30 in the device width direction. The mounts 42 include a left mount 42L on the device width direction left side, and a right mount 42R. The left mount 42L includes an upright portion 42A that extends in the device vertical direction and has a substantially L-shape as viewed from the device rear, and an extension portion 42B that extends from the upright portion 42A toward the upper side and width direction inner side of the device. The right mount 42R includes an upright portion 42C that extends in the device vertical direction and has a substantially L-shape as viewed from the device rear, and an extension portion 42D that extends from the upright portion 42C toward the upper side and width direction inner side of the device. Note that the right mount 42R is set with a larger device width dimension than the left mount 42L.

As illustrated in FIG. 2 and FIG. 4, the mounts 42 each include a clip 50, ribs 52, and a hook 56. The ribs 52 include an upper rib 52A at the device upper side of the corresponding mount 42, and a lower rib 52B at the device lower side of the corresponding mount 42.

Specifically, the clip 50 of the left mount 42L is formed projecting toward the device front at a position at the device upper side of the upright portion 42A, namely substantially at the device vertical direction center of the extension portion 42B. The upper rib 52A of the left mount 42L is formed projecting toward the device front at a leading end of the extension portion 42B. Moreover, the lower rib 52B of the left mount 42L is formed projecting toward the device front at a device lower side of the extension portion 42B.

The clip 50 of the right mount 42R is formed projecting toward the device front at a position at the device upper side of the upright portion 42C, namely at the device lower side of the extension portion 42D. The upper rib 52A of the right mount 42R is formed projecting toward the device front at a leading end of the extension portion 42D. The lower rib 52B of the right mount 42R is formed projecting toward the device front at a position at the device lower side of the extension portion 42D.

As illustrated in FIG. 4, each of the clips 50 includes a plate shaped support portion 50A projecting toward the device front from the extension portion 42B or the extension portion 42D, and a substantially C-shaped retaining portion 50B (see FIG. 6) extending toward the device rear from a device front end portion of the support portion 50A, and open toward the device rear side. A pair of claws 50C are formed at the upper and lower sides of the retaining portion 50B. As illustrated in FIG. 6, the device rear side of the retaining portion 50B is formed so as to be capable of elastic deformation along the device vertical direction, and each of the pair of claws 50C is capable of approaching the other in the device vertical direction. Attachment holes 26 are provided in the bracket 20 at positions corresponding to the clips 50. The clips 50 are inserted through the respective attachment holes 26 and the claws 50C are anchored to the bracket 20, thereby fixing the sensor protector 40 to the bracket 20.

Note that in the present exemplary embodiment, when referenced against an anchor position of the clips 50 to the bracket 20 in the device front-rear direction, each of the ribs 52 (upper ribs 52A and lower ribs 52B) is designed so as to have a dimension that projects to the device front of the bracket 20 by approximately 0.3 mm. Accordingly, the ribs 52 retreat toward the device rear side by 0.3 mm when the clips 50 are anchored to the bracket 20. As described above, the sensor protector 40 of the present exemplary embodiment is made of resin, and when the ribs 52 retreat toward the device rear, elastic force generates a pressing force toward the device front. Namely, in the present exemplary embodiment, in a state in which the clips 50 have been anchored to the bracket 20, the ribs 52 press against the bracket 20. A force pulling the clips 50 in toward the device rear side is thereby generated in the clips 50 sandwiched between the upper ribs 52A and the lower ribs 52B.

The mounts 42 further include a pair of the hooks 56, at the upright portion 42A and the upright portion 42C. Specifically, the hook 56 of the left mount 42L is formed projecting from the upright portion 42A toward the device upper side at a substantially intermediate position between the clip 50 and the upper rib 52A in the device width direction. The hook 56 of the right mount 42R is formed projecting from the upright portion 42C toward the device upper side at a substantially intermediate position between the clip 50 and the upper rib 52A in the device width direction.

As illustrated in FIG. 3, the cover 44 is a plate shaped member extending from device lower side end portions of the pair of mounts 42 toward the rear bumper cover 14 side (see FIG. 6). More precisely, the cover 44 extends from device lower side end portions of the upright portion 42A and the upright portion 42C of the mounts 42 toward the device rear. The cover 44 includes a base 44A extending from the upright portion 42A of the corresponding mount 42 toward the device rear side, and a base 44B extending from the upright portion 42C of the corresponding mount 42 toward the device rear side. The cover 44 also includes a protective plate 44C formed contiguously to the base 44A and the base 44B and extending toward the device rear and device lower side, and a wall 44E extending vertically toward the device lower side from an outer edge of the protective plate 44C.

As illustrated in FIG. 6, the device rear side of the protective plate 44C is disposed in a state inclined by 20° with respect to the device front-rear direction. More specifically, the protective plate 44C is disposed at an incline toward the device lower side (vehicle vertical direction lower side) on progression toward the device rear side (vehicle front-rear direction outer side). This thereby enables the detection range of the sensor 30 to be effectively secured in comparison to cases in which the protective plate 44C is disposed running along the device front-rear direction.

Namely, electromagnetic waves are emitted from the transmission/reception face 30A of the sensor 30 toward the vehicle front-rear direction outer side in a radiating pattern (see the region between the pair of straight lines S in FIG. 6). Accordingly, by disposing the device rear side of the protective plate 44C in a state inclined by 20° with respect to the device front-rear direction, the protective plate 44C is prevented from interfering with the electromagnetic waves emitted from the sensor 30 toward the vehicle front-rear direction outer side and vehicle lower side. Due to this configuration, the detection range of the sensor 30 is effectively secured, and the detection precision of the sensor is improved in comparison to cases in which the protective plate 44C is disposed running along the vehicle front-rear direction.

Moreover, as illustrated in FIG. 5, as viewed from above the device, the protective plate 44C includes a circular arc portion 44D configuring an end portion of the cover 44 on the rear bumper cover 14 side, and a triangular portion 44H. The circular arc portion 44D is formed with a substantially semicircular profile convex toward the device rear side, and is configured by a main body 44F that is disposed at the rear side of the sensor 30 in the device front-rear direction, and by an extension portion 44G formed so as to be contiguous to the main body 44F. The extension portion 44G extends toward the right side from a device width direction right end portion of the main body 44F, and projects to the right side of the sensor 30 as viewed along the device front-rear direction. In other words, the extension portion 44G is disposed at the vehicle front-rear direction outer side (vehicle rear side) and vehicle width direction inner side of the sensor 30. The circular arc portion 44D has a profile conforming to the back face of the rear bumper cover 14. More specifically, the circular arc portion 44D has a profile approximated to an outline of a portion of the back face of the rear bumper cover 14 that opposes the circular arc portion 44D. Moreover, the triangular portion 44H is integrally formed to a device width direction left side (vehicle width direction outer side) of the circular arc portion 44D, and has a substantially triangular profile as viewed from above the device. The triangular portion 44H connects the base 44A of the cover 44 to a device width direction left end portion of the circular arc portion 44D.

Moreover, as illustrated in FIG. 3, the cover 44 includes an opening 44J that opens toward the device front at the device front and device width direction center of the cover 44. Namely, the opening 44J forms a substantially rectangular recess at the device front side of the cover 44 when the sensor protector 40 is viewed from above the device.

The groove portions 46 are formed in a device upper side face of the cover 44, and are configured by three grooves that are aligned in a row along the device width direction. The groove portions 46 are provided at a join portion between the base 44A and the protective plate 44C, and at a join portion between the base 44B and the protective plate 44C. Note that the groove portions 46 of the present exemplary embodiment are formed as a weak portion where the cover 44 is capable of deforming.

As illustrated in FIG. 2 to FIG. 6, an upper face of the circular arc portion 44D is provided with the electromagnetic wave shield 48. Specifically, the electromagnetic wave shield 48 is set so as to cover at least a reflected wave passage region K set at the upper face of the circular arc portion 44D (see the region K illustrated in FIG. 5).

Note that the reflected wave passage region K is a region of the planar face of the circular arc portion 44D configuring a device front-rear direction rear side (substantially a vehicle front-rear direction outer side) of a region spanning from a central portion to a device width direction right end portion (vehicle width direction inner end portion) of the sensor 30. Specifically, out of electromagnetic waves emitted along the device front-rear direction from a central portion of the transmission/reception face 30A of the sensor 30, the reflected wave passage region K is a region where the electromagnetic waves that are reflected by the back face of the rear bumper cover 14 would contact (where the electromagnetic wave would pass through) the upper face of the circular arc portion 44D to reach one length direction end portion of the reinforcement 16.

The electromagnetic wave shield 48 is formed by sticking a metallic foil tape to the upper face of the circular arc portion 44D. Electromagnetic waves incident to the electromagnetic wave shield 48 are thus reflected such that their angle of incidence to and their angle of reflection from the upper face of the circular arc portion 44D are substantially equal. Accordingly, when some of the electromagnetic waves emitted from the sensor 30 are reflected by the back face of the rear bumper cover 14 and reach the reflected wave passage region K, the reflected waves can be reflected by the electromagnetic wave shield 48 and prevented from reaching the reinforcement 16. As a result, the reinforcement 16 is prevented from being incorrectly detected as an obstacle at the vehicle rear side by the sensor 30.

Figure 7A:
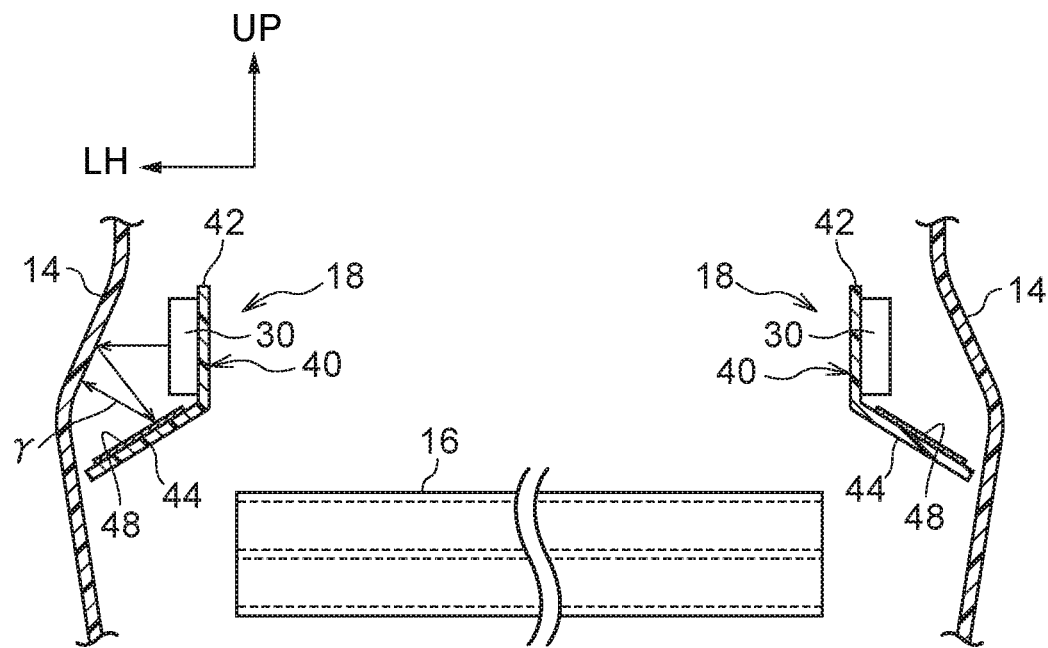
FIG. 7A is a schematic view illustrating an example of an electromagnetic wave path taken by electromagnetic waves emitted from a sensor of a vehicle mounted with the sensor assembly illustrated in FIG. 1.
Figure 7B:
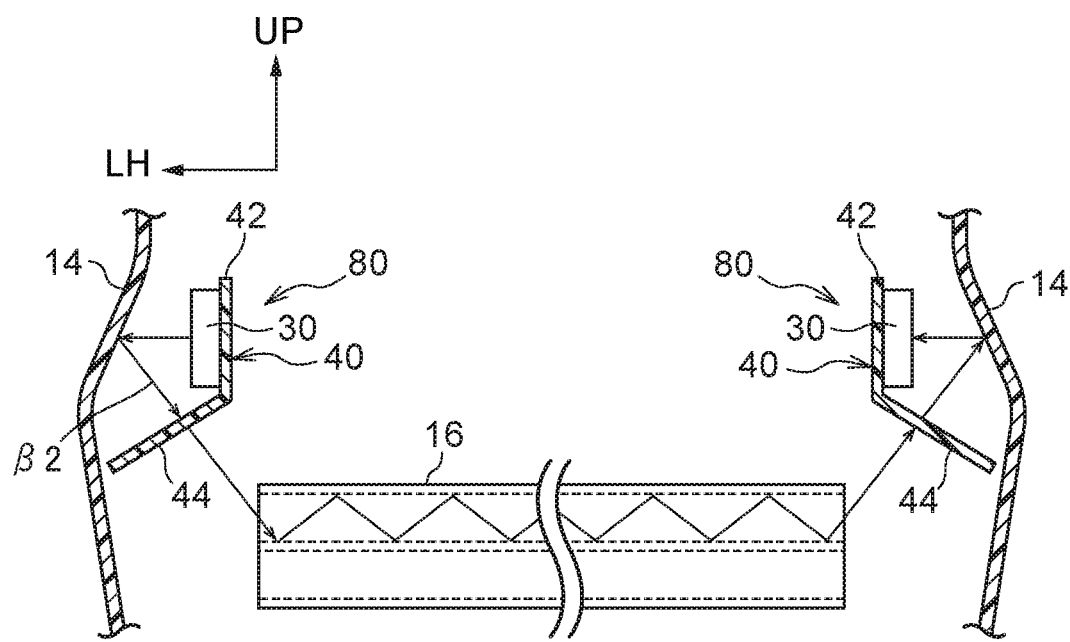
FIG. 7B is a schematic view illustrating an example of an electromagnetic wave path taken by electromagnetic waves emitted from a sensor of a vehicle mounted with a sensor assembly of a comparative example.

Detailed explanation follows regarding the advantageous effect of the electromagnetic wave shield 48 preventing the reinforcement 16 from being incorrectly detected as an obstacle at the vehicle rear side by the sensor 30, with reference to FIG. 7A and FIG. 7B. FIG. 7A is a schematic diagram illustrating a positional relationship between the sensor assembly 18 and the bumper reinforcement 16 in the present exemplary embodiment. An electromagnetic wave path of electromagnetic waves emitted from the sensor 30 disposed at the rear left of the vehicle and reflected by the back face of the rear bumper cover 14 is schematically illustrated by the arrow γ. Moreover, FIG. 7B is a schematic diagram corresponding to FIG. 7A, illustrating a case in which a sensor assembly 80, which is not provided with the electromagnetic wave shield 48 at the upper face of the cover 44 configuring the sensor protector 40, is mounted in place of the sensor assembly 18 of the present exemplary embodiment. In FIG. 7B, an electromagnetic wave path of electromagnetic waves emitted from the sensor 30 disposed at the rear left of the vehicle and reflected by the back face of the rear bumper cover 14 is schematically illustrated by the arrow β2.

As illustrated in FIG. 7B, in a configuration in which the electromagnetic wave shield 48 is not provided at the upper face of the cover 44 configuring the sensor protector 40, some of the electromagnetic waves reflected by the back face of the rear bumper cover 14 pass through the cover 44 and reach one length direction end portion of the reinforcement 16. As described above, the reinforcement 16 is configured by a metal material, such as an aluminum-based metal material, and is formed with a hollow, substantially rectangular beam profile. Accordingly, the electromagnetic waves that reach the one length direction end portion of the reinforcement 16 are repeatedly reflected by inner faces of the reinforcement 16 with very little attenuation, and are then emitted from the other length direction end portion of the reinforcement 16 and received by the sensor 30 near to the other end portion. The reinforcement 16 is incorrectly detected as an obstacle at the vehicle rear side by this sensor 30. Although not illustrated in the drawings, it is also conceivable that electromagnetic waves emitted from the other length direction end portion of the reinforcement 16 might be reflected repeatedly so as to re-enter the inside of the reinforcement 16 from the other length direction end portion and return to the sensor 30 near to the one length direction end portion of the reinforcement 16. In this manner, electromagnetic waves that pass through the cover 44 and reach the reinforcement 16 invite incorrect detection by the sensor 30 as a result of moving back and forth toward the left and right inside the reinforcement 16.

By contrast, in the sensor assembly 18 illustrated in FIG. 7A, electromagnetic waves that are reflected by the back face of the rear bumper cover 14 and reach the cover 44 are reflected by the electromagnetic wave shield 48, and so do not pass to the lower side of the cover 44. This suppresses the electromagnetic waves reflected by the back face of the rear bumper cover 14 from reaching the reinforcement 16, thereby preventing incorrect detection by the sensor 30.

Operation and Advantageous Effects

Explanation follows regarding operation and advantageous effects of the present exemplary embodiment.

The sensor protector 40 configured as described above includes the mounts 42 mounted to the bracket 20, and the plate shaped cover 44 extending from the lower portions of the mounts 42 toward the rear bumper cover 14 and covering the lower portion of the sensor 30.

The rear bumper cover 14 of the present exemplary embodiment is open toward the vehicle lower side, this being the road surface side of the sensor 30. Were the sensor 30 to face the road surface side directly, faults such as the following might arise. For example, a stone kicked up during travel could enter the interior of the rear bumper cover 14 and damage the sensor 30 directly, or snow blowing in the vicinity could enter the interior of the rear bumper cover 14 and adhere to the periphery of the sensor 30, causing incorrect detection by the sensor 30. By contrast, in the sensor protector 40 described above, the lower portion of the sensor 30 is covered by the cover 44 as viewed from the vehicle lower side, thereby enabling the sensor 30 to be protected even if for example a stone kicked up during travel or snow blowing in the vicinity were to enter the interior of the rear bumper cover 14.

The electromagnetic wave shield 48 is provided to the upper face of the protective plate 44C configuring the cover 44 so as to cover at least the reflected wave passage region K. Accordingly, if some of the electromagnetic waves emitted from the transmission/reception face 30A of the sensor 30 are reflected by the back face of the rear bumper cover 14, reflected waves reaching the protective plate 44C are reflected by the electromagnetic wave shield 48, and do not pass through the protective plate 44C. Accordingly, electromagnetic waves reflected by the back face of the rear bumper cover 14 are suppressed from passing through the reflected wave passage region K and reaching the reinforcement 16. Moreover, reflected waves are also suppressed from passing through regions of the protective plate 44C outside of the reflected wave passage region K, thereby suppressing the reflected waves from reaching members disposed at the lower side of the sensor 30. This enables the reinforcement 16 and the like to be prevented from being incorrectly detected as obstacles at the vehicle rear side by the sensor 30.

Moreover, the mounts 42 of the sensor protector 40 of the present exemplary embodiment are mounted to the bracket 20 configured to fix the sensor 30 to the back panel 12 of the vehicle 10. The sensor protector 40 is thus fixed to the body of the vehicle 10 through the bracket 20. Moreover, a vehicle front-rear direction outer side end portion of the cover 44 is disposed so as to be separated from the rear bumper cover 14 (see FIG. 6). This thereby enables the protection performance of the sensor 30 to be improved by suppressing the transmission of load to the sensor protector 40, even if the rear bumper cover 14 is deformed in a rear collision of the vehicle 10.

Moreover, as described above, the sensor protector 40 and the rear bumper cover 14 are disposed so as to be separated from each other, thereby enabling application in cases in which the positional relationship between the sensor 30 and the rear bumper cover 14 varies according to the vehicle size. This thereby enables the sensor protector 40 to be commonly applied in plural vehicle models, enabling the versatility of the sensor protector 40 to be increased.

Moreover, in the present exemplary embodiment, the cover 44 (protective plate 44C) of the sensor protector 40 is disposed so as to be inclined toward the lower side in the vehicle vertical direction on progression toward the vehicle front-rear direction outer side. This thereby enables a broader detection range of the sensor 30 to be secured than in cases in which the cover 44 is disposed running along the vehicle front-rear direction. Namely, electromagnetic waves are emitted from the sensor 30 toward the vehicle front-rear direction outer side in a radiating pattern (see the region between the pair of straight lines S in FIG. 6). Accordingly, by disposing the cover 44 so as to be inclined toward the vehicle vertical direction lower side on progression toward the vehicle front-rear direction outer side, the cover is prevented from interfering with the electromagnetic waves emitted from the sensor 30 toward the vehicle front-rear direction outer side and vehicle lower side. This thereby enables the detection range of the sensor 30 to be more effectively secured than in cases in which the cover 44 is disposed running along the vehicle front-rear direction.

Moreover, in the present exemplary embodiment, the groove portions 46 are provided to the cover 44 of the sensor protector 40 so as to run along the width direction of the sensor 30 and serve as a weak portion where the cover 44 is capable of deforming. Accordingly, even if the rear bumper cover 14 deforms greatly in a vehicle rear collision and the back face of the rear bumper cover 14 contacts the sensor protector 40, the cover 44 deforms at the groove portions 46 such that impact to the rear bumper cover 14 is not readily transmitted to the sensor 30 and the back panel 12. The protection performance of the sensor 30 and the back panel 12 is thereby improved.

Moreover, in the present exemplary embodiment, the weak portion is configured by the groove portions 46, these being grooves formed along the width direction of the sensor 30. This thereby enables impact force imparted to the sensor 30 and the back panel 12 by the rear bumper cover 14 to be reduced by the simple configuration of providing grooves.

Moreover, in the present exemplary embodiment, the circular arc portion 44D configuring the end portion on the rear bumper cover 14 side of the cover 44 is formed so as to conform to an inner wall of the rear bumper cover 14. Different attachment positions in the front-rear and left-right directions, and different vehicle models, can thus be accommodated by adapting the cover 44 to the profile of the rear bumper cover 14. Namely, common members can be employed for the bracket 20 and the sensor 30, while differences in design according to region on the vehicle and vehicle model can be accommodated by producing sensor protectors 40 in which only the design of the cover 44 is modified. This thereby enables the bracket and protector to be made smaller than an attachment member in which a protector and a bracket for attachment to a vehicle body are integrated together, thereby enabling a reduction in warehouse space.

Note that the weak portion of the present exemplary embodiment is configured by the groove portions 46 in the cover 44, these being three grooves that overlap each other when viewed along the device width direction; however, there is no limitation thereto. For example, a weak portion may be configured by a single groove running along the device width direction. Alternatively, the groove portions 46 may be configured by more than three grooves. Alternatively, for example, a weak portion may be configured by plural grooves provided to the cover 44 so as to run along the device width direction and to form a row in the device front-rear direction. The grooves configuring such a weak portion are not limited to being formed on the device upper side face, and may be formed on a device lower side face. Moreover, in cases in which plural grooves are provided in the device front-rear direction, such grooves may be alternately provided on a device upper side face and a device lower side face.

Moreover, the electromagnetic wave shield 48 of the present exemplary embodiment is configured by a metallic foil tape stuck to the upper face of the cover 44. However, the present disclosure is not limited thereto. For example, a steel plate or the like may be fixed to the upper face of the cover 44 by adhesion, fastening, or the like, or the sensor protector 40 itself may be made of metal. Alternatively, for example, an electromagnetic wave shield may be configured by sticking an electromagnetic wave absorbing member, configured by mixing carbon into a rubber material, to the upper face of the cover 44. In such cases, electromagnetic waves reaching the upper face of the cover 44 are absorbed by the electromagnetic wave absorbing member, thereby enabling electromagnetic waves emitted from the sensor 30 to be suppressed from passing through the cover 44 and reaching the reinforcement 16 or the like.

Moreover, the electromagnetic wave shield 48 of the present exemplary embodiment is provided to the upper face of the cover 44. However, the present disclosure is not limited thereto, and an electromagnetic wave shield may be configured by sticking a metallic foil tape to a lower face of the cover 44. In such cases, the electromagnetic wave shield is capable of suppressing electromagnetic waves that have reached the reinforcement 16 or the like and have been reflected by the reinforcement 16 from passing through the cover 44 from the lower side to the upper side. Electromagnetic waves reflected by the reinforcement 16 or the like are thereby suppressed from passing through the cover and reaching the sensor 30, enabling a similar advantageous effect to that of the exemplary embodiment described above, namely preventing incorrect detection by the sensor 30. Alternatively, for example, an electromagnetic wave absorbing member configured by mixing carbon into a rubber material may be stuck to the lower face of the cover 44.

Moreover, in the present exemplary embodiment, the mounts 42 and the cover 44 are formed integrally to each other, and the electromagnetic wave shield 48 is provided to the upper face of the cover 44. However, the present disclosure is not limited thereto, and mounts and a cover may be formed separately to each other, and an electromagnetic wave shield may be provided at the cover interior. Namely, a sheet configured by a metallic foil or the like, a steel plate, an electromagnetic wave absorbing member, or the like may be insert-molded in the interior of a resin cover to provide an electromagnetic wave shield. Alternatively, a cover may be configured by adhering two plates above and below each other, with an electromagnetic wave shield configured by a metallic foil sheet, an electromagnetic wave absorbing member, or the like being provided sandwiched between the two plates. Alternatively, a cover may be resin cast from a resin material into which carbon has been mixed, such that the cover itself functions as an electromagnetic wave shield.

The sensor assembly 18 of the present exemplary embodiment is disposed at a corner section of the rear section of the vehicle 10. However, the present disclosure is not limited thereto, and the sensor assembly 18 may be disposed at a corner section of a front section of the vehicle 10.

What is claimed is:

1. A sensor protector, comprising:
a mount that is mounted at a bracket configured to fix a sensor, provided at an inner side of a bumper cover, to a body of a vehicle;
a plate-shaped cover that extends from a lower portion of the mount toward the bumper cover with an end portion of the cover, at an outer side in a vehicle front-rear direction, separated from the bumper cover, and that covers a lower portion of the sensor as viewed from a lower side of the vehicle, wherein the cover is separated from an inner surface of the bumper cover and from the lower portion of the sensor; and
an electromagnetic wave shield provided to at least a portion of the cover.

2. The sensor protector of claim 1, wherein the cover is disposed so as to be inclined toward a lower side in a vehicle vertical direction on progression toward the outer side in the vehicle front-rear direction.

3. The sensor protector of claim 1, wherein a weak portion, configured to enable the cover to deform along a width direction of the sensor, is formed at the cover.

4. The sensor protector of claim 1, wherein:
the sensor is provided at an inner side of an outer end portion, in a vehicle width direction, of the bumper cover; and
the electromagnetic wave shield is provided at a position on the cover covering a region positioned at an outer side, in the vehicle front-rear direction, of a region extending at least from a central portion of the sensor to an inner end portion of the sensor in the vehicle width direction.

5. The sensor protector of claim 1, wherein a weak portion formed at the cover is configured by a groove formed along a width direction of the sensor.

6. The sensor protector of claim 1, wherein the cover is disposed at an inner side of a curved corner section formed at respective length direction end portions of the bumper cover, and is formed with a circular arc profile conforming to an external profile of the corner section.

7. A vehicle, comprising:
a bumper cover that is provided at an end portion, at an outer side in a vehicle front-rear direction, of a body of the vehicle;
a bracket that is attached to the end portion of the body at an inner side, in the vehicle front-rear direction, of the bumper cover;
a sensor that is attached to the bracket; and
the sensor protector of claim 1, the sensor protector being attached to the bracket so as to cover a lower portion of the sensor.

8. A sensor protector, comprising:
a mount that is mounted at a bracket configured to fix a sensor, provided at an inner side of a bumper cover, to a body of a vehicle;
a plate-shaped cover that extends from a lower portion of the mount toward the bumper cover with an end portion of the cover, at an outer side in a vehicle front-rear direction, separated from the bumper cover, and that covers a lower portion of the sensor as viewed from a lower side of the vehicle, and an opening is formed in a part of the cover facing the lower portion of the sensor; and
an electromagnetic wave shield provided to at least a portion of the cover.

9. The sensor protector of claim 8, wherein the cover is disposed so as to be inclined toward a lower side in a vehicle vertical direction on progression toward the outer side in the vehicle front-rear direction.

10. The sensor protector of claim 8, wherein a weak portion, configured to enable the cover to deform along a width direction of the sensor, is formed at the cover.

11. The sensor protector of claim 8, wherein:
the sensor is provided at an inner side of an outer end portion, in a vehicle width direction, of the bumper cover; and
the electromagnetic wave shield is provided at a position on the cover covering a region positioned at an outer side, in the vehicle front-rear direction, of a region extending at least from a central portion of the sensor to an inner end portion of the sensor in the vehicle width direction.

12. The sensor protector of claim 8, wherein a weak portion formed at the cover is configured by a groove formed along a width direction of the sensor.

13. The sensor protector of claim 8, wherein the cover is disposed at an inner side of a curved corner section formed at respective length direction end portions of the bumper cover, and is formed with a circular arc profile conforming to an external profile of the corner section.

14. A vehicle, comprising:
a bumper cover that is provided at an end portion, at an outer side in a vehicle front-rear direction, of a body of the vehicle;
a bracket that is attached to the end portion of the body at an inner side, in the vehicle front-rear direction, of the bumper cover;
a sensor that is attached to the bracket; and
the sensor protector of claim 8, the sensor protector being attached to the bracket so as to cover a lower portion of the sensor.

* * * * *